United States Patent [19]

Drake, Jr.

[11] Patent Number: 5,006,760
[45] Date of Patent: Apr. 9, 1991

[54] CAPACITIVE FEED FOR PLASMA REACTOR

[75] Inventor: Herbert G. Drake, Jr., San Rafael, Calif.

[73] Assignee: Motorola, Inc., Schaumburg, Ill.

[21] Appl. No.: 1,773

[22] Filed: Jan. 9, 1987

[51] Int. Cl.$^5$ .............................................. H05B 31/26
[52] U.S. Cl. ........................... 315/111.21; 315/111.31; 315/111.71; 315/111.91
[58] Field of Search ...................... 315/111.21, 111.31, 315/111.71, 111.91; 156/345; 250/423 R

[56] References Cited

U.S. PATENT DOCUMENTS 3,489,933  1/1970  Meyerand ............................. 310/11
4,209,357  6/1980  Gorin et al. ......................... 156/345

Primary Examiner—Michael Razavi
Attorney, Agent, or Firm—Paul F. Wille

[57] ABSTRACT

A capacitive feed is disclosed for the lower electrode in a parallel plate plasma reactor. One plate of the capacitor comprises the lower electrode or a contact to the lower electrode. The other plate of the capacitor comprises an annular member insulated from the lower electrode, or the contact. There are no RF connections directly to the lower electrode.

5 Claims, 1 Drawing Sheet

CAPACITIVE FEED FOR PLASMA REACTOR

BACKGROUND OF THE INVENTION

This invention relates to plasma reactors and, in particular, to coupling radio frequency (RF) energy into the reactor volume.

In the prior art, plasma reactors have been used for dry chemical treating of a variety of products, including semiconductor wafers. In all of these processes, whether for etching or depositing, RF power must be coupled into the reactor to create a plasma discharge. The plasma discharge creates the reactive species which are used to treat the wafer. The RF power can be coupled into the reactor either inductively or capacitively. Virtually all current reactors use capacitive coupling for RF energy.

As with any other system handling RF energy, the efficiency of the coupling depends upon the impedance match of the components. In a typical plasma reactor, RF energy is coupled to the lower electrode. The lower electrode is moveable to facilitate loading and unloading wafers. Thus, the RF power is necessarily coupled to the electrode by way of a coaxial cable which is much longer than the actual distance between the RF amplifier and the reactor chamber and is subject to frequent flexing as the reactor is operated. Further, as the result of operating the reactor, even with etch processes, deposits form on the electrode which precludes a simple mechanical contact as a reliable means of exciting the moveable electrode. Because of the length of the coaxial cable and the flexing, it is quite likely to leak RF, which must then be contained by the enclosure of the reactor. These problems are made more difficult by the fact that a plasma reactor looks like a high impedance which results in a high VSWR in the flexible cable with resulting power loss, heating of the cable, and spurious radiation.

In view of the foregoing, it is therefore an object of the present invention to provide improved RF coupling to a chamber.

Another object of the present invention is to provide a mechanism for capacitively coupling RF energy into a plasma reactor.

A further object of the present invention is to capacitively couple RF energy to a moveable electrode.

Another object of the present invention is to eliminate coaxial cable connections to a moveable electrode.

A further object of the present invention is to automatically disable a plasma reactor upon opening the chamber.

The foregoing objects are achieved in the present invention wherein a plasma reactor chamber contains a coupling ring electrically insulated from the conductive chamber walls. A conductive lower electrode, when moved into position to close the chamber, is adjacent the ring and separated therefrom by an insulator. The electrode and ring have an annular area of overlap and thus form two plates of a capacitor and form a coupling capacitor for applying RF energy to the chamber. When the chamber is opened the capacitor no longer exists and no RF power is coupled to the lower electrode.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
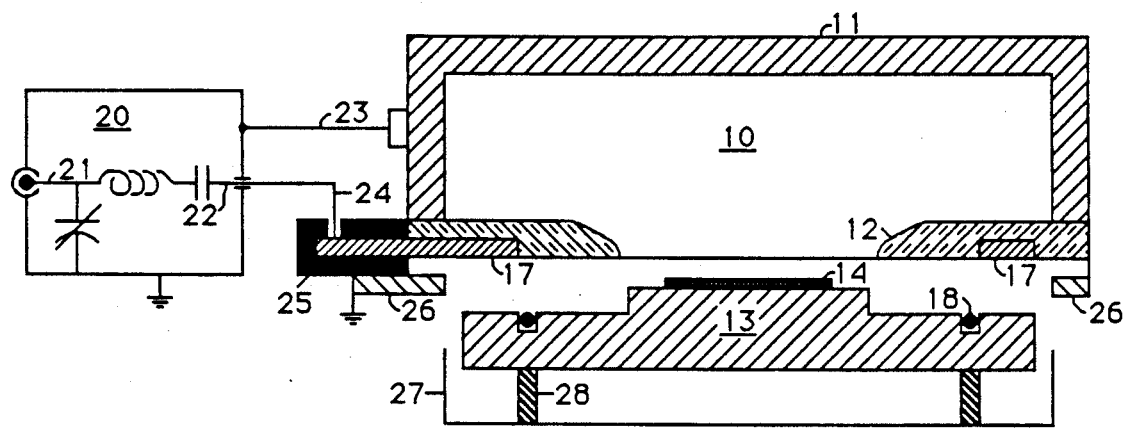
FIG. 1 illustrates a plasma reactor in accordance with the present invention.

FIG. 1 illustrates a preferred embodiment of the present invention wherein the lower electrode of a plasma reactor functions as one electrode of a coupling capacitor. Specifically, chamber 10 comprises an upper electrode 11 and a lower electrode 13 separated by dielectric ring 12. Lower electrode 13 serves as a stage for holding wafer 14 in chamber 10 for processing.

RF power is supplied to chamber 10 by way of matching network 20. Matching network 20 comprises an input 21 and an output 22 interconnected by suitable reactive components to provide a match between a power amplifier (not shown) and chamber 10. Matching network 20 is grounded and the ground lead is connected by way of lead 23 to upper electrode 11. The RF signal is coupled by way of lead 24 to conductive ring 17 which is enclosed in insulating sleeve 25. Adjacent to conductive ring 17 is ground ring 26 which provides contact about the perimeter of lower electrode 13 for electromagnetic shield 27. Shield 27 is separated from lower electrode 13 by suitable insulators, such as insulator 28. Shield 27 preferably comprises a resilient portion at the perimeter thereof for engaging ground ring 26.

In operation, a wafer is placed upon lower electrode 13 and lower electrode 13 is raised into position to close chamber 10. Electrode 13 is sealed by any suitable means such as 0-ring 18. In this closed position, shield 27 engages ground ring 26 and electrode 13 is positioned immediately adjacent conductive ring 17. Conductive ring 17 has a thin insulating coating which electrically separates conductive ring 17 from lower electrode 13, which is also conductive.

Figure 2:
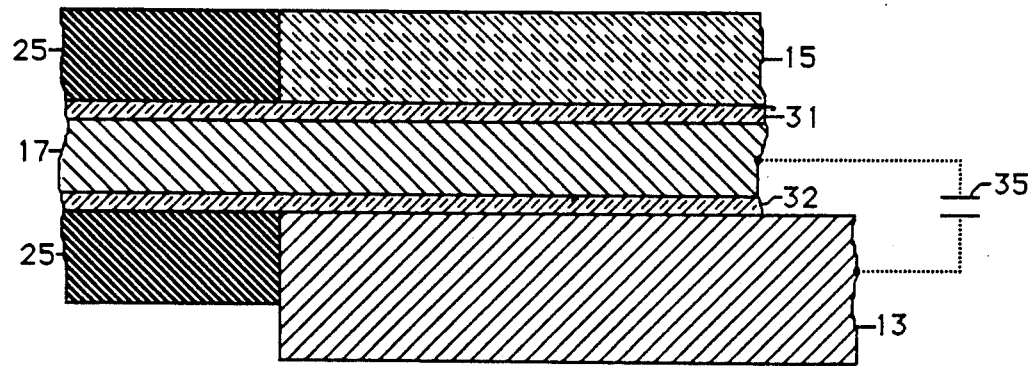
FIG. 2 illustrates a detail of the coupling ring and lower electrode.

As more fully illustrated in FIG. 2, conductive ring 17 preferably comprises hard anodized aluminum, i.e. ring 17 has aluminum oxide layer 31 formed on the upper surface thereof and aluminum oxide layer 32 formed on the lower surface there. Layer 31 can be omitted as desired. Dielectric layer 32 separates conductive ring 17 from lower electrode 13 and preferably has a thickness of 0.05 to 0.07 mm. Thus, these two conductive members form the plates of a capacitor separated by a dielectric, as schematically represented by capacitor 35.

RF power applied to input 21 of FIG. 1 is coupled by way of lead 24 to conductive ring 17. From conductive ring 17, the RF power is coupled to chamber 10 through electrode 13 and wafer 14 by way of coupling capacitor 35. At the end of the process cycle, electrode 13 is lowered, thereby not only providing access to wafer 14 but also breaking the connection to the source of RF power. In addition, the electromagnetic shield is opened. Thus, electrode 13 is in a completely unpowered state, even if the RF power should accidentally be continued.

There is thus provided by the present invention an improved coupling system for applying RF power to a plasma reactor. No flexible connections are necessary since the lower electrode is completely disconnected as soon as the chamber is opened. Further, no direct electrical connection is made between the source of RF power and the lower electrode, i.e. there is a nonresistive coupling. Because the connections can be placed immediately adjacent to the chamber, there is greatly reduced loss of power due to the length of the connections and any flexing or bending of the conductors. In addition, since the connection is not exposed to the plasma, the coupling of RF energy to the chamber does not deteriorate with use of the chamber.

Having thus described the invention it will be apparent to those of skill in the art that various modifications can be made within the spirit and scope of the present invention. For example, while described in connection with a diode plasma reactor, it is understood that the present invention applies equally well to triode reactors. Similarly, while dielectric layer 32 can conveniently comprise aluminum oxide, other dielectrics and dielectric thicknesses can be used to control the impedance of the connection. While electromagnetic shield 27 is preferably connected to electrode 13 the shield could comprise a fixed portion of the equipment.

I claim:

1. In a plasma reactor having an enclosed volume in which a plasma is generated between a grounded electrode and a moveable, powered electrode separated by an insulator, the improvement comprising means for capacitively coupling RF power to said enclosed volume wherein said means comprises a conductive ring for overlapping a portion of said moveable electrode and a second insulator for separating said conductive ring from said moveable electrode to form a capacitor with said moveable electrode.

2. The reactor as set forth in claim 1 wherein said second insulator comprises a coating on said conductive ring.

3. The reactor as set forth in claim 2 and further comprising an electromagnetic shield connected to said lower electrode.

4. The reactor as set forth in claim 3 and further comprising a ground ring for engaging said electromagnetic shield when said lower electrode closes said reactor.

5. A method for coupling RF power to a plasma glow discharge formed between two electrodes comprising the step of:

capacitively coupling RF power to said discharge through a series capacitor wherein one plate of said series capacitor is one of said electrodes.

* * * * *